(12) United States Patent
Mochizuki

(10) Patent No.: US 8,089,088 B2
(45) Date of Patent: Jan. 3, 2012

(54) LIGHT EMITTING DEVICE

(75) Inventor: Masamitsu Mochizuki, Fujimi (JP)

(73) Assignee: Seiko Epson Corporation (JP)

( * ) Notice: Subject to any disclaimer, the term of this patent is extended or adjusted under 35 U.S.C. 154(b) by 171 days.

(21) Appl. No.: 12/687,337

(22) Filed: Jan. 14, 2010

(65) Prior Publication Data

US 2010/0187966 A1 Jul. 29, 2010

(30) Foreign Application Priority Data

Jan. 29, 2009 (JP) ................................. 2009-018306

(51) Int. Cl.
*H01L 33/00* (2010.01)
(52) U.S. Cl. ............ 257/98; 257/E33.006; 257/E33.069
(58) Field of Classification Search ...................... 257/98, 257/E33.006, E33.069
See application file for complete search history.

(56) References Cited

U.S. PATENT DOCUMENTS

| 5,539,571 | A | * | 7/1996 | Welch et al. ................... 359/344 |
| 5,555,544 | A | * | 9/1996 | Walpole et al. ............... 372/50.1 |
| 7,436,873 | B2 | | 10/2008 | Sugitatsu et al. |
| 2009/0003397 | A1 | | 1/2009 | Sugitatsu et al. |
| 2010/0155759 | A1 | * | 6/2010 | Nagawa ........................... 257/98 |

FOREIGN PATENT DOCUMENTS

| JP | 11-064789 | 3/1999 |
| JP | 2004-296560 | 10/2004 |
| JP | 2005-064471 | 3/2005 |
| JP | 2007-220922 | 8/2007 |

* cited by examiner

*Primary Examiner* — Trung Q Dang
(74) *Attorney, Agent, or Firm* — Harness, Dickey & Pierce, P.L.C.

(57) ABSTRACT

A light emitting device includes an active layer; at least a portion of the active layer constitutes a gain region. The gain region is continuous from a first end surface and a second end surface. The gain region has a first reflective surface and a second reflective surface for reflecting light generated by the gain region. The first reflective surface and second reflective surface extend from the first end surface to the second end surface. The gain region includes a first portion extending from the first end surface to the first reflective surface in a direction tilted with respect to a normal to the first side surface as viewed two-dimensionally; a second portion extending from the second end surface to the second reflective surface in a direction tilted with respect to a normal to the first side surface as viewed two-dimensionally; and a third portion extending from the first reflective surface to the second reflective surface in a direction tilted with respect to a normal to the first reflective surface as viewed two-dimensionally. A distributed Bragg reflector or a photonic crystal region is provided to at least one of a side of the first reflective surface and a side of the second reflective surface.

11 Claims, 8 Drawing Sheets

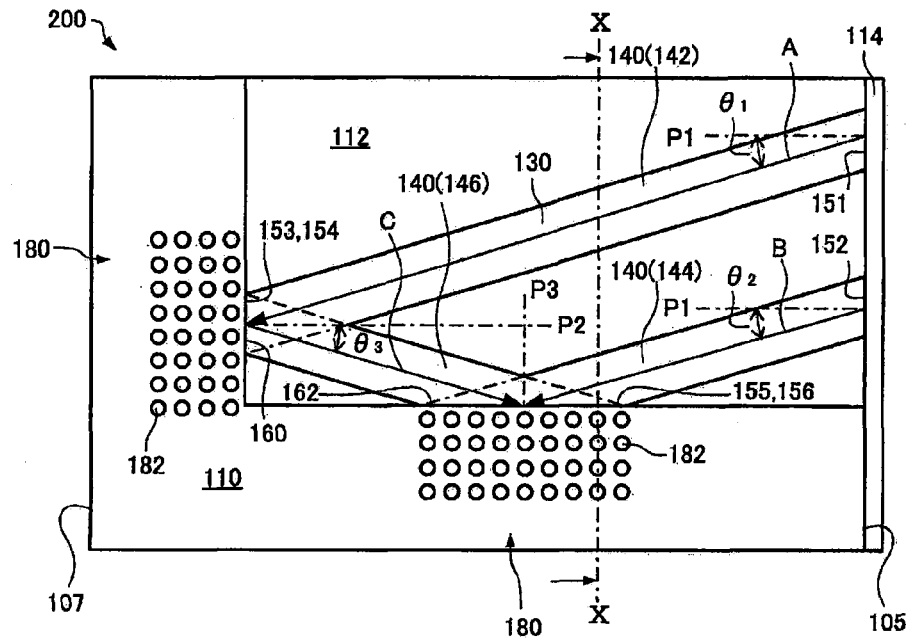
F I G. 9
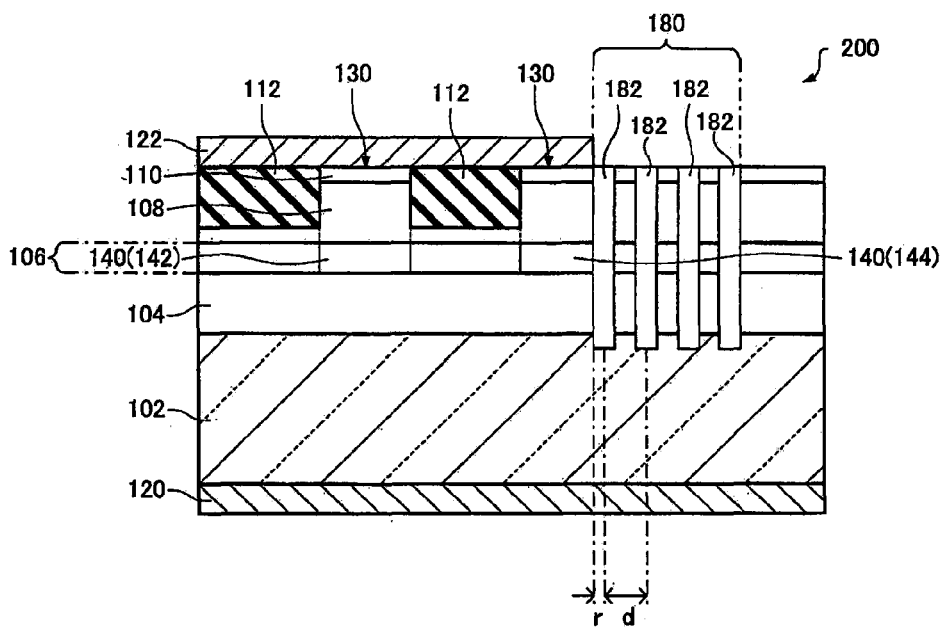
F I G. 10

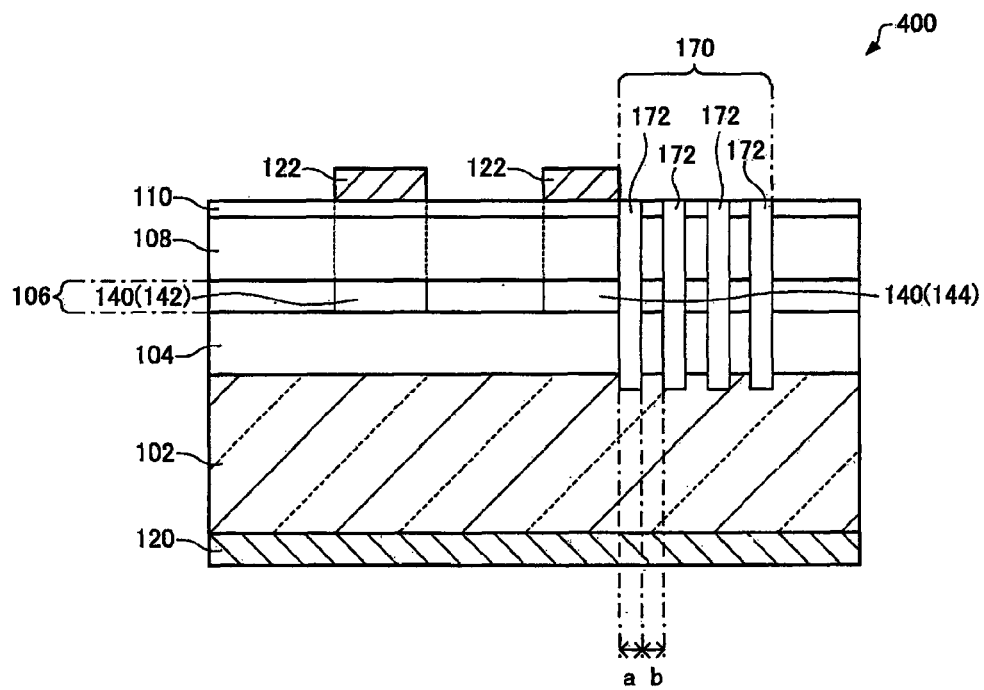
F I G. 13
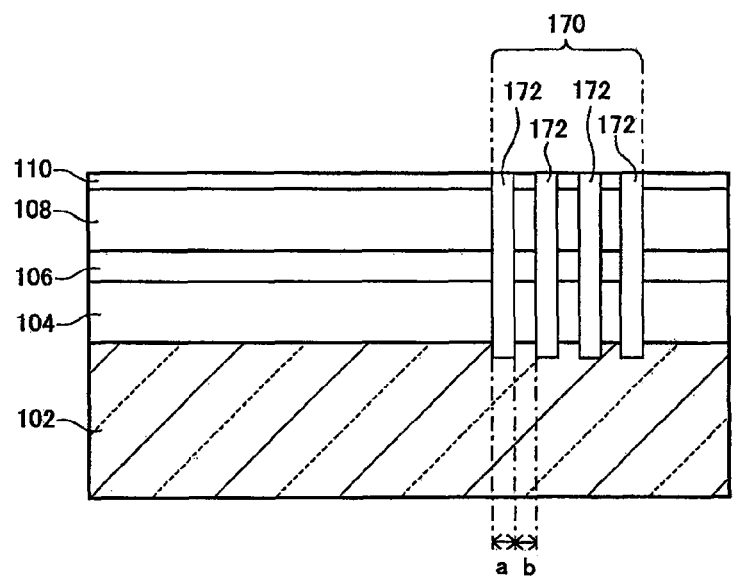
F I G. 14

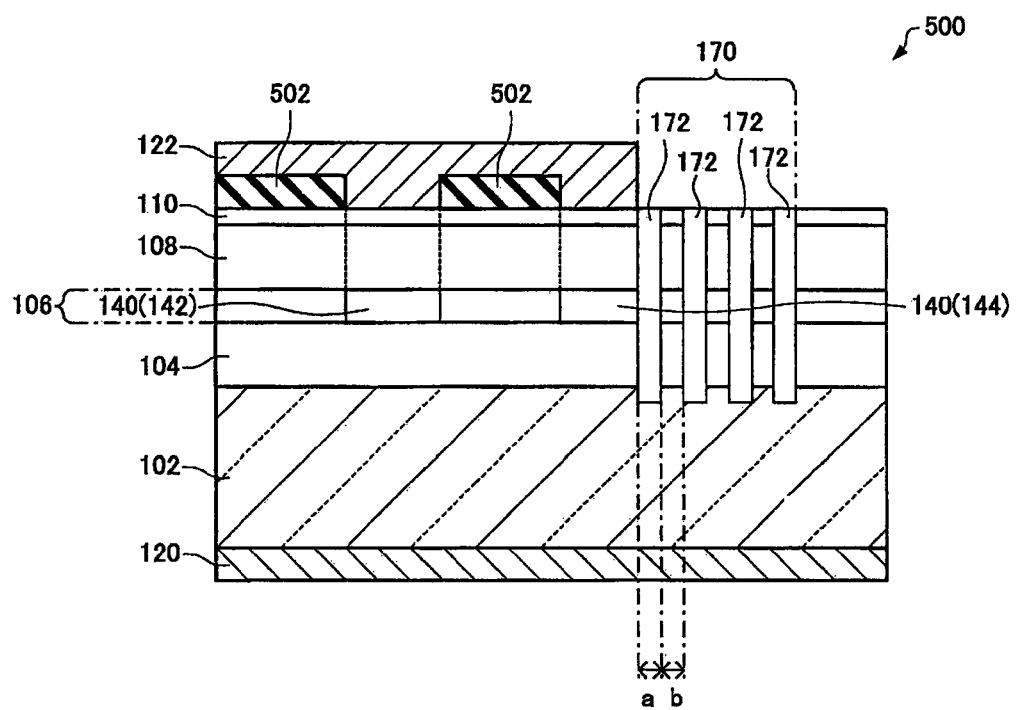
F I G. 15

LIGHT EMITTING DEVICE

CROSS-REFERENCE TO RELATED APPLICATIONS

This application claims priority to Japanese Patent Application No. 2009-018306 filed on Jan. 29, 2009. The entire disclosure of Japanese Patent Application No. 2009-018306 is hereby incorporated herein by reference.

BACKGROUND

1. Technical Field

The present invention relates to a light emitting device.

2. Related Art

Laser devices having high luminance and excellent color reproduction properties have been anticipated in recent years as light emitting devices for use as light sources for projectors, displays, and other display devices. However, speckle noise that occurs from mutual interference of scattered and reflected light at the screen surface is sometimes problematic. In order to address this problem, a method has been proposed in Japanese Laid-Open Patent Publication No. 11-64789, for example, in which the screen is vibrated to uniform the speckle pattern and thereby reduce the speckle noise.

SUMMARY

However, in the method disclosed in Japanese Laid-Open Patent Publication No. 11-64789, new problems sometimes occur, such as limitation of the screen, the need for a motor or other member for moving the screen, and background sound from the motor or the like.

A common LED (Light Emitting Diode) may also be used as the light emitting device for the light source in order to reduce speckle noise. However, adequate light output is sometimes not obtained from an LED.

An advantage of the present invention is to provide a novel light emitting device having high output and the capability of reducing speckle noise.

A light emitting device according to a first aspect includes a first cladding layer, an active layer formed above the first cladding layer, and a second cladding layer formed above the active layer. At least a portion of the active layer constitutes a gain region. The gain region is continuous from a first end surface provided to a first side surface of the active layer to a second end surface provided to the first side surface. The gain region has a first reflective surface and a second reflective surface for reflecting light generated by the gain region, and the first reflective and the second reflective surface enable the gain region to extend from the first end surface to the second end surface. The gain region includes a first portion extending from the first end surface to the first reflective surface in a direction tilted with respect to a normal to the first side surface as viewed two-dimensionally; a second portion extending from the second end surface to the second reflective surface in a direction tilted with respect to a normal to the first side surface as viewed two-dimensionally; and a third portion extending from the first reflective surface to the second reflective surface in a direction tilted with respect to a normal to the first reflective surface as viewed two-dimensionally. A distributed Bragg reflector or a photonic crystal region is provided to at least one of a side of the first reflective surface and a side of the second reflective surface. At least a portion of the light generated by the gain region that passes through the first reflective surface or the second reflective surface is returned to the gain region by the distributed Bragg reflector or photonic crystal region. The light generated by the gain region is emitted from the first end surface and the second end surface.

In the light emitting device according to the first aspect of the present invention, laser oscillation of light generated by the gain regions can be suppressed or prevented, as described hereinafter. Speckle noise can therefore be reduced. Furthermore, in the light emitting device according to the first aspect of the present invention, the light generated by the gain regions can be amplified while propagating in the gain regions, and be emitted to the outside. Consequently, a higher output than that of the conventional LED can be obtained. Through the present invention as described above, a novel light emitting device can be provided that has high output and the capability of reducing speckle noise.

In the description of the present invention, the wording "above" is used to denote that "a specific member (hereinafter referred to as "member B") is formed "above" another specific member (hereinafter referred to as "member A")," for example. In the description of the present invention, in a case such as the one illustrated by the example above, the wording "above" is used to include such cases as when member B is formed directly on member A, and such cases as when member B is formed via another component on member A.

In the light emitting device according to a second aspect of the present invention, a configuration may be adopted in which the first reflective surface of the gain region is parallel to the first side surface of the active layer as viewed two-dimensionally, the normal to the first reflective surface and the normal to the second reflective surface are orthogonal, and the distributed Bragg reflector or the photonic crystal region is provided to a side of the second reflective surface.

In the light emitting device according to a third aspect of the present invention, the light generated by the gain region may be totally reflected by the second reflective surface.

In the light emitting device according to a fourth aspect of the present invention, the direction in which the first portion extends and the direction in which the second portion extends may be the same direction.

In the light emitting device according to a fifth aspect of the present invention, the distributed Bragg reflector may include a plurality of grooves arranged at a predetermined interval.

In the light emitting device according to a sixth aspect of the present invention, a bottom surface of the grooves may be positioned further downward than a lower side surface of the active layer.

In the light emitting device according to a seventh aspect of the present invention, the photonic crystal region may include a plurality of holes arranged periodically in a predetermined lattice arrangement in the in-plane direction of the active layer.

In the light emitting device according to an eighth aspect of the present invention, a configuration may be adopted in which the shape of each of the plurality of holes is columnar, and a bottom surface of the holes is positioned further downward than a lower surface of the active layer.

In the light emitting device according to a ninth aspect of the present invention, an antireflective film may be provided to the first side surface.

In the light emitting device according to a tenth aspect of the present invention, a plurality of the gain regions may be provided.

The light emitting device according to an eleventh aspect of the present invention may include a first electrode electrically connected to the first cladding layer; and a second electrode electrically connected to the second cladding layer.

In the description of the present invention, the wording "electrically connected" is used to describe a specific member (hereinafter referred to as "member D") that is "electrically connected" to another specific member (hereinafter referred to as "member C"), for example. In the description of the present invention, in a case such as the one illustrated by the example above, the wording "electrically connected" is used as including such cases as when member C and member D are directly adjacent and electrically connected to each other, and such cases as when member C and member D are electrically connected via another member.

BRIEF DESCRIPTION OF THE DRAWINGS

Referring now to the attached drawings which form a part of this original disclosure:

FIG. 9 is a schematic plan view showing a first modification of the light emitting device according to the first embodiment;

FIG. 10 is a schematic sectional view showing a first modification of the light emitting device according to the first embodiment;

FIG. 13 is a schematic sectional view showing the light emitting device according to the second embodiment;

FIG. 14 is a schematic sectional view showing the steps for manufacturing the light emitting device of the second embodiment; and FIG. 15 is a schematic sectional view showing a modification of the light emitting device according to the second embodiment.

DETAILED DESCRIPTION OF EXEMPLARY EMBODIMENTS

Preferred embodiments of the present invention will be described hereinafter with reference to the drawings.

1. First Embodiment 1.1. The light emitting device 100 according to a first embodiment will first be described.

Figure 1:
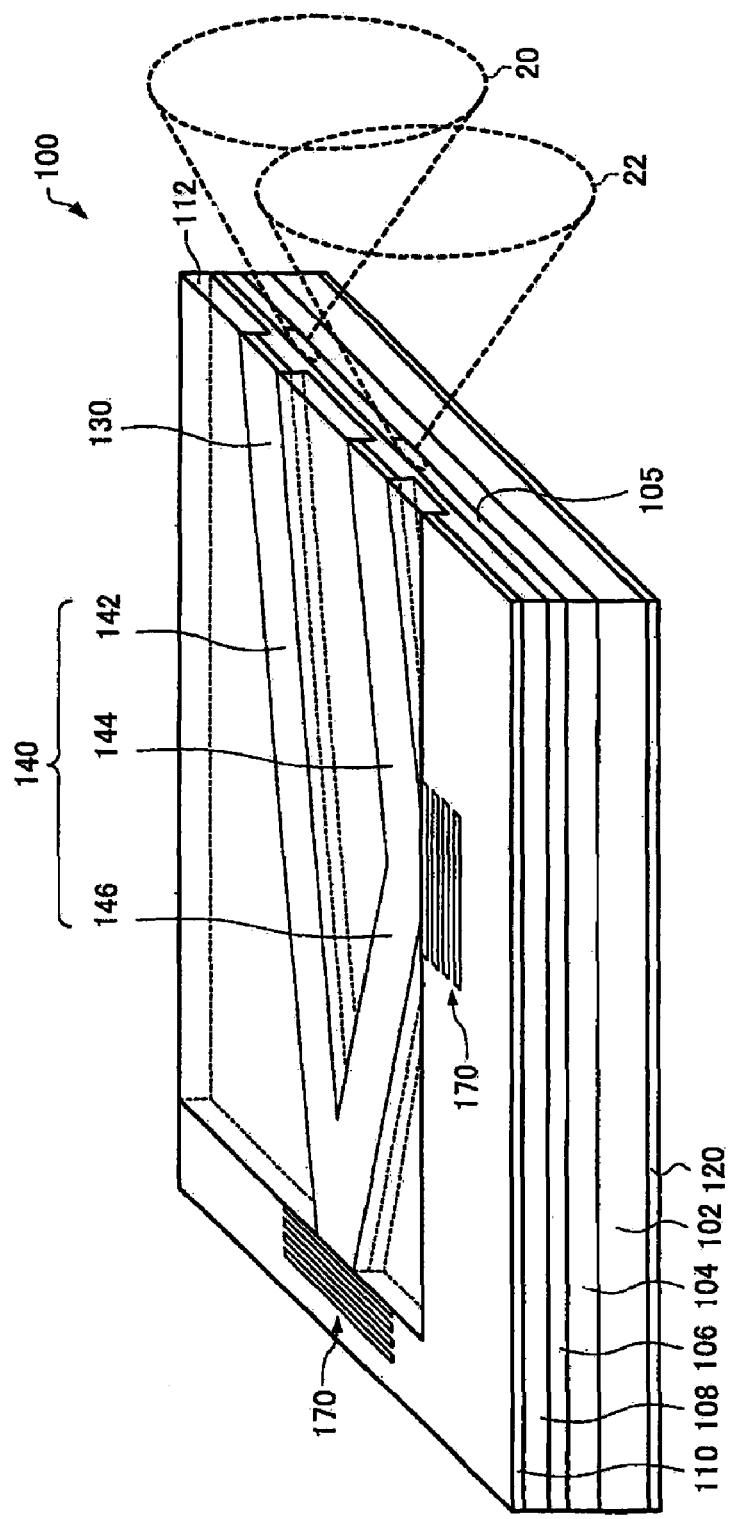
FIG. 1 is a schematic perspective view showing the light emitting device according to the first embodiment.
Figure 2:
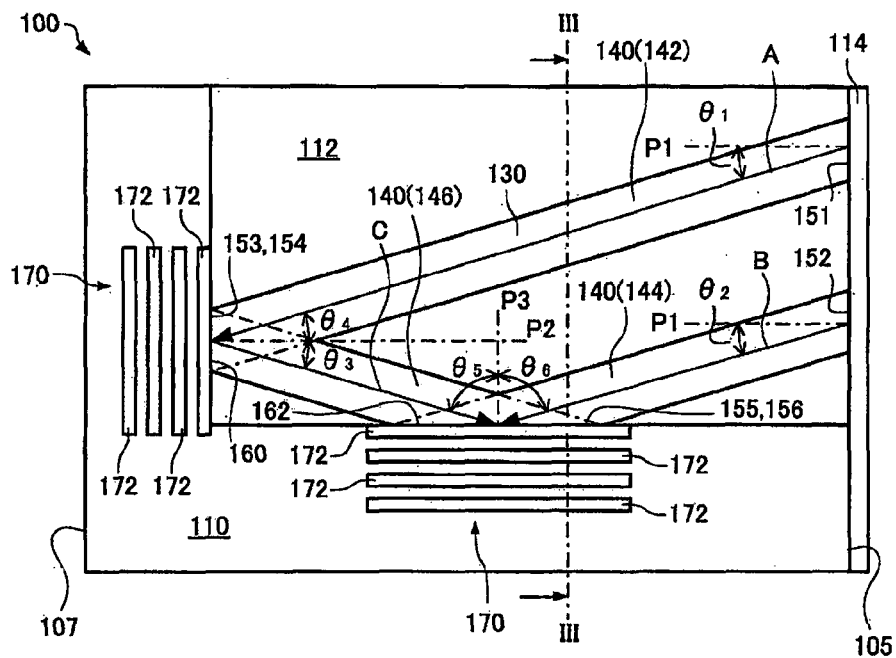
FIG. 2 is a schematic plan view showing the light emitting device according to the first embodiment.
Figure 3:
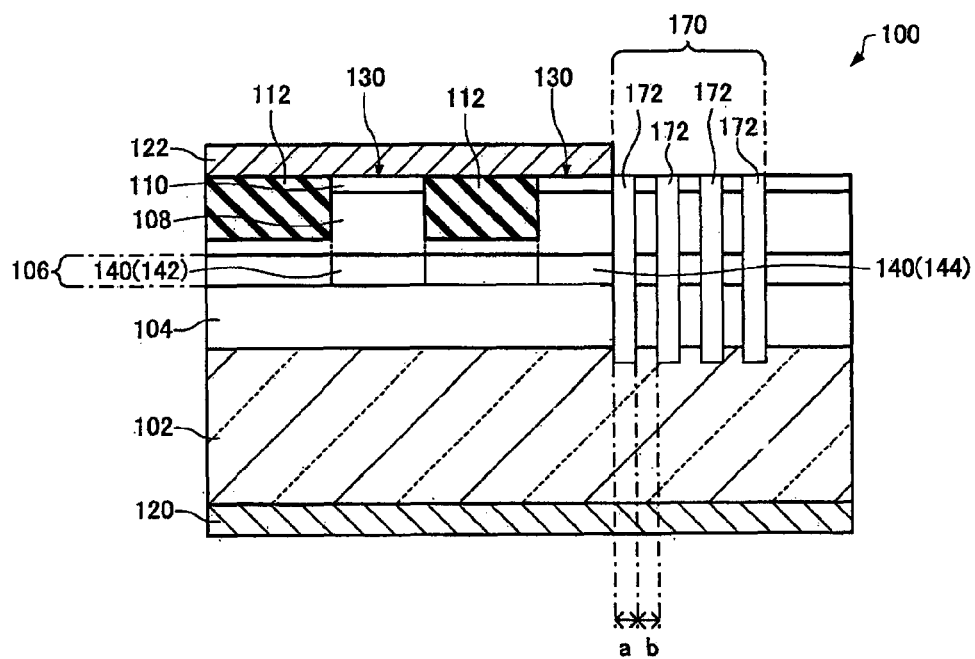
FIG. 3 is a schematic sectional view showing the light emitting device according to the first embodiment.

FIG. 1 is a schematic perspective view showing the light emitting device 100. FIG. 2 is a schematic plan view showing the light emitting device 100. FIG. 3 is a sectional view along line III-III of FIG. 2. The second electrode 122 and the antireflective film 114 are omitted in FIG. 1 for the sake of convenience. The second electrode 122 is omitted in FIG. 2 for the sake of convenience. A case is described in which the light emitting device 100 is an InGaAlP-type (red) semiconductor device.

As shown in FIGS. 1 through 3, the light emitting device 100 includes a first cladding layer 104, an active layer 106, and a second cladding layer 108. The light emitting device 100 may further include a substrate 102, a contact layer 110, an insulation part 112, an antireflective film 114, a first electrode 120, a second electrode 122, and a distributed Bragg reflector (also referred to hereinafter as a DBR) 170.

A first conductive (e.g., n-type) GaAs substrate or the like, for example, may be used as the substrate 102.

The first cladding layer 104 is formed on the substrate 102. The first cladding layer 104 is composed of a first conductive semiconductor, for example. An n-type AlGaInP layer or the like, for example, may be used as the first cladding layer 104. Although not shown in the drawing, a buffer layer may be formed between the first substrate 102 and the first cladding layer 104. A first conductive (n-type) GaAs layer, InGaP layer, or the like, for example, having more satisfactory crystal properties (e.g., low defect density) than the substrate 102, for example, may be used as the buffer layer.

The active layer 106 is formed on the first cladding layer 104. The active layer 106 has a multiple quantum well (MQW) structure in which three quantum well structures composed of an InGaP well layer and an InGaAlP barrier layer are stacked, for example.

A portion of the active layer 106 constitutes a gain region. The gain region 140 is capable of generating light, and this light can be amplified within the gain region 140. The active layer 106 may have a rectangular (including cuvic) or other shape, for example. The active layer 106 has a first side surface 105 and a second side surface 107. The first side surface 105 and second side surface 107 are parallel to each other, for example.

The gain region 140 is continuous from a first end surface 151 provided to the first side surface 105 of the active layer 106 to a second end surface 152 provided to the first side surface 105. The gain region 140 also may have a first reflective surface 160 and a second reflective surface 162 for reflecting the light generated by the gain region 140, between the first end surface 151 and the second end surface 152. The gain region 140 is composed of a first portion 142, a second portion 144, and a third portion 146. The first portion 142 extends from the first end surface 151 to the first reflective surface 160 in a direction tilted with respect to the normal P1 of the first side surface 105 as viewed two-dimensionally (see FIG. 2). The second portion 144 extends from the second end surface 152 to the second reflective surface 162 in a direction tilted with respect to the normal P1 of the first side surface 105 as viewed two-dimensionally. The third portion 146 extends from the first reflective surface 160 to the second reflective surface 162 in a direction tilted with respect to the normal P2 of the first reflective surface 160 as viewed two-dimensionally. Laser oscillation of the light generated by the gain region 140 can thereby be suppressed or prevented. The light emitting device 100 can therefore generate light that is not laser light.

The first portion 142 has the first end surface 151 provided to the first side surface 105, and a third end surface 153 that constitutes the first reflective surface 160. The first portion 142 extends from the first end surface 151 to the third end surface 153 in a direction A having a tilt of angle $\theta_1$ with respect to the normal P1 of the first side surface 105, as shown in FIG. 2. The direction A in which the first portion 142 extends can be referred to as the direction in which the center of the first end surface 151 and the center of the third end surface 153 are connected as viewed two-dimensionally, for example. The planar shape of the first portion 142 is a parallelogram, for example.

The second portion 144 has the second end surface 152 provided to the first side surface 105, and a sixth end surface 156 that constitutes the second reflective surface 162. The second portion 144 extends from the second end surface 152 to the sixth end surface 156 in a direction B having a tilt of angle $\theta_2$ with respect to the normal P1 of the first side surface 105, as shown in FIG. 2. The direction B in which the second portion 144 extends can be referred to as the direction in which the center of the second end surface 152 and the center of the sixth end surface 156 are connected as viewed two-dimensionally, for example. The planar shape of the second portion 144 is a trapezoid in which the two end surfaces other than the second end surface 152 and the sixth end surface 156 are parallel to each other, for example. The direction A in which the first portion 142 extends and the direction B in which the second portion 144 extends are the same direction in the example shown. The first emitted light 20 emitted from the first end surface 151 and the second emitted light 22 emitted from the second end surface 152 can thereby proceed in the same direction. Although not shown in the drawing, the direction A in which the first portion 142 extends and the direction B in which the second portion 144 extends may also be mutually different.

The third portion 146 has a fourth end surface 154 that constitutes the first reflective surface 160, and a fifth end surface 155 that constitutes the second reflective surface 162, as shown in FIG. 2. The third portion 146 extends from the fourth end surface 154 to the fifth end surface 155 in a direction C having a tilt of angle $\theta_3$ with respect to the normal P2 of the first reflective surface 160, as shown in FIG. 2. The direction C in which the third portion 146 extends can be referred to as the direction in which the center of the fourth end surface 154 and the center of the fifth end surface 155 are connected as viewed two-dimensionally, for example. The planar shape of the third portion 146 is a trapezoid in which the two end surfaces other than the fourth end surface 154 and the fifth end surface 155 are parallel to each other, for example.

Figure 4:
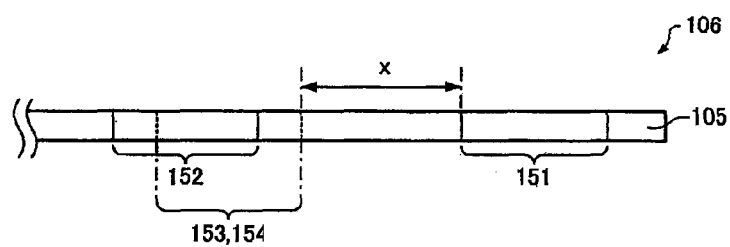
FIG. 4 is a plan view showing the active layer according to the first embodiment from the side of the first side surface.

FIG. 4 is a view showing the active layer 106 in a plane as viewed from the side of the first side surface 105. As shown in FIG. 4, the third end surface 153 and the first end surface 151 of the first portion 142 do not overlap. The light generated by the first portion 142 thereby can be prevented from directly undergoing multiple reflection between the first end surface 151 and the third end surface 153. As a result, since the creation of a direct resonator can be prevented, laser oscillation of the light generated by the first portion 142 can be more reliably suppressed or prevented. In this case, it is sufficient insofar as the offset width x between the first end surface 151 and the third end surface 153 is a positive value in the gain region 140, for example, as shown in FIG. 4. In the example shown in FIG. 4, the second end surface 152 of the second portion 144, and the fourth end surface 154 of the third portion 146 are overlapped. As shown in FIG. 2, the region in which the second end surface 152 and the fourth end surface 154 are directly connected includes a region in which the second portion 144 and third portion 146 are not formed. Such a region in which the gain region is not formed is an absorption region. Therefore, even if direct multiple reflection occurs between the second end surface 152 and the fourth end surface 154, adequate gain for oscillation cannot be obtained. In the example shown in FIG. 4, the second end surface 152 and the fourth end surface 154 are partially overlapped, but the second end surface 152 and the fourth end surface 154 may also be arranged so as not to overlap. Oscillation can thereby be prevented at higher outputs as well.

The first reflective surface 160 is composed of the third end surface 153 of the first portion 142, and the fourth end surface 154 of the third portion 146. In the example shown, the third end surface 153 and the fourth end surface 154 completely overlap each other, and the first reflective surface 160 coincides with the third end surface 153 and the fourth end surface 154. Although not shown in the drawing, the third end surface 153 and the fourth end surface 154 may partially overlap each other. The first reflective surface 160 may be parallel to the first side surface 105 as viewed two-dimensionally (see FIG. 2). The angle $\theta_4$ formed by the normal P2 of the first reflective surface 160 and the direction A in which the first portion 142 extends, and the angle $\theta_3$ formed by the normal P2 of the first reflective surface 160 and the direction C in which the third portion 146 extends are equal, for example. A DBR 170 is provided on the side of the first reflective surface 160 in the example shown in FIG. 2. A high reflectance can thereby be obtained from the first reflective surface 160. Although not shown, a dielectric mirror may be provided on the side of the first reflective surface 160 instead of the DBR 170 by adopting a configuration in which the first reflective surface 160 is formed by the second side surface 107 by a cleavage or other technique.

The second reflective surface 162 is composed of the fifth end surface 155 of the third portion 146, and the sixth end surface 156 of the second portion 144. In the example shown, the fifth end surface 155 and the sixth end surface 156 completely overlap each other, and the second reflective surface 162 coincides with the fifth end surface 155 and the sixth end surface 156. Although not shown in the drawing, the fifth end surface 155 and the sixth end surface 156 may partially overlap each other. The normal P2 of the first reflective surface 160 and the normal line P3 of the second reflective surface 162 are orthogonal in the example shown. The angle $\theta_5$ formed by the normal line P3 of the second reflective surface 162 and the direction C in which the third portion 146 extends, and the angle $\theta_6$ formed by the normal line P3 of the second reflective surface 162 and the direction B in which the second portion 144 extends are equal, for example. The light generated by the gain region 140 may undergo total reflection at the second reflective surface 162, for example. A case in which the light generated by the gain region 140 is totally reflected at the second reflective surface 162 is a case in which the angle $\theta_6$ of the direction B in which the second portion 144 extends and the angle $\theta_5$ of the direction C in which the third portion 146 extends with respect to the normal line P3 of the second reflective surface 162 are each equal to or greater than a critical angle $\theta_C$, for example. The DBR 170 may be provided on the side of the second reflective surface 162, as shown in FIG. 2. A high reflectance can thereby be obtained from the second reflective surface 162. The scattered light that could not be totally reflected at the second reflective surface 162 can also be returned to the DBR 170, for example. Although not shown, a dielectric minor may be provided instead of the DBR 170 on the side of the second reflective surface 162 by adopting a configuration in which the second reflective surface 162 is formed by a side surface of the active layer 106 other than the first side surface 105 and second side surface 107 of the active layer 106 through the use of a cleavage or other technique, for example.

The reflectance of the first reflective surface 160 and second reflective surface 162 is preferably higher than the reflectance of the first end surface 151 and second end surface 152 in the wavelength range of the light generated by the gain region 140. Specifically, the reflectance of the first reflective surface 160 and second reflective surface 162 is preferably close to 100%. In contrast the reflectance of the first end surface 151 and second end surface 152 is preferably close to 0%. Providing the antireflective film 114, for example, enables low reflectance to be obtained from the first end surface 151 and second end surface 152. The antireflective film 114 may be provided to the entire surface of the first side surface 105. An $Al_2O_3$ single layer, an $SiO_2$ layer, an SiN layer, a $Ta_2O_5$ layer, or a multilayer film composed of these layers, for example, may be used as the antireflective film 114. Providing the DBR 170 on the side of the first reflective surface 160 and second reflective surface 162 enables high reflectance to be obtained.

The DBR 170 may be provided to at least one of the side of the first reflective surface 160 and the side of the second reflective surface 162. In the example shown in FIG. 2, the DBR 170 is provided to the side of the first reflective surface 160 and the side of the second reflective surface 162. The DBR 170 can be composed of a plurality of grooves 172 arranged at a predetermined interval. The planar shape of the grooves 172 is rectangular, for example. The bottom surface of the grooves 172 is preferably positioned lower than the lower side surface of the active layer 106. In the example shown in FIG. 3, the bottom surface of the grooves 172 is positioned lower than the upper surface of the substrate 102. The insides of the grooves 172 may be hollow (air) or filled with an insulation material. The filling material may also be a semiconductor or other conductive material insofar as the material is electrically separated from the gain region 140. Four grooves 172 are provided in the example shown, but this number is not limiting. A DBR 170 having higher reflectance can be obtained by increasing the number of grooves 172.

In the DBR 170 on the side of the first reflective surface 160, the grooves 172 may be arranged so that the size of the width "a" of the grooves 172 is $(2m_a+1)\lambda/(4n_a \cos \theta_3')$ or $(2m_a+1)\lambda/(4n_a \cos \theta_4')$, and the size of the interval "b" of the grooves 172 is $(2m_b+1)\lambda/(4n_b \cos \theta_3)$ or $(2m_b+1)\lambda/(4n_b \cos \theta_4)$. In these expressions, $m_a$ and $m_b$ are integers equal to 0 or higher, 2 is the wavelength of the light generated by the gain region 140, $n_a$ is the effective refractive index of the vertical cross-section of the grooves 172, and $n_b$ is the effective refractive index of the vertical cross-section in the region in which the grooves 172 are not formed. The angles $\theta_3'$ and $\theta_4'$ are refraction angles in a case of incidence on the first reflective surface 160 at the angle $\theta_3$ or $\theta_4$ from the gain region 140, wherein $\theta_3'=\sin^{-1}((n_b/n_a)\sin \theta_3)$, and $\theta_4'=\sin^{-1}((n_b/n_a)\sin \theta_4)$. Grooves 172 having a predetermined width a are provided at a predetermined interval b, whereby low-refracting regions and high-refracting regions are provided in alternating fashion. The DBR 170 can thereby be formed. On the other hand, in the DBR 170 provided to the side of the second reflective surface 162, regardless of the direction of the gain region, the grooves are preferably arranged so that the size of the width a is $(2m_a+1)\lambda/4n_a$, and the size of the interval b is $(2m_b+1)\lambda/4n_b$. The reason for this is that in the first reflective surface 160, most of the light that passes through the reflective surface propagates in the directions of the refraction angles $\theta_3'$ and $\theta_4'$, whereas in the second reflective surface 162, most of the light that incidents the reflective surface is light that is diffused and not totally reflected, and is therefore not directional.

Figure 5:
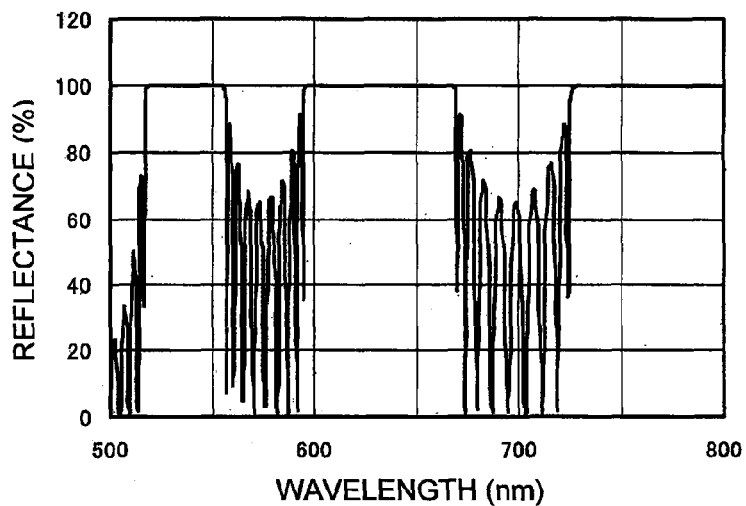
FIG. 5 is a graph showing the wavelength dependence of the reflectance of the DBR of the first embodiment.

FIG. 5 is a graph showing the wavelength dependence of reflectance for the vertically incident component in the second reflective surface 162 when the size of the width a of the grooves 172 is 472.5 nm ($m_a=1$) and the size of the interval b of the grooves 172 is 423.64 nm ($m_b=4$). In this instance, diffraction in the direction perpendicular to the paper surface in FIG. 2 is ignored. The size of each of the width a and interval b of the grooves 172 is 400 nm or greater, which is a size that can be formed by a photolithography technique. As shown in FIG. 5, an adequate reflection spectrum can be obtained even when the DBR 170 is of a size that allows formation by a photolithography technique. Consequently, the DBR 170 can easily be manufactured using a photolithography technique. The size of the width a and the size of the interval b can be made to approach a ratio of 1:1 by satisfying the following relationship: $m_a=n_a/(n_b \times m_b)$. The DBR 170 can thereby be easily manufactured when an interference exposure or other method is used as well.

The second cladding layer 108 is formed on the active layer 106. The second cladding layer 108 is composed of a second conductive (p-type, for example) semiconductor, for example. A p-type AlGaInP layer, for example, can be used as the second cladding layer 108.

For example, a pin diode is formed by a p-type second cladding layer 108, the active layer 106 not doped with an impurity, and an n-type first cladding layer 104. The first cladding layer 104 and the second cladding layer 108 are each layers having a larger forbidden band gap width and a smaller refractive index than the active layer 106. The active layer 106 has the function of amplifying light. The first cladding layer 104 and second cladding layer 108 sandwich the active layer 106 and have the function of confining in injection carriers (electrons and positive holes) and light.

In the light emitting device 100, when a forward bias voltage of the pin diode is applied across the first electrode 120 and second electrode 122, recombination of electrons and holes occurs in the gain region 140 of the active layer 106. Light is generated by this recombination. Then stimulated emission that originates in the recombination occurs, and the intensity of the light is amplified within the gain region 140. For example, a portion of the light generated by the first portion 142 of the gain region 140 is reflected by the first reflective surface 160 and the second reflective surface 162 in sequence and emitted as second emitted light 22 from the second end surface 152, and the light intensity is amplified during this process. In the same manner, a portion of the light generated by the second portion 144 is reflected by the second reflective surface 162 and the first reflective surface 160 in sequence and emitted as first emitted light 20 from the first end surface 151, and the light intensity is amplified during this process. Some of the light generated by the first portion 142 is emitted as first emitted light 20 directly from the first end surface 151. In the same manner, some of the light generated by the second portion 144 is emitted as second emitted light 22 directly from the second end surface 152. These portions of light are amplified in each of the gain portions in the same manner. Moreover, a portion of the light generated by the third portion 146 is reflected at the first reflective surface 160, for example, and emitted as first emitted light 20. A portion of the light generated by the third portion 146 is reflected at the second reflective surface 162, for example, and emitted as second emitted light 22. The intensity of these portions of light is also amplified in the intervening gain portions. At least a portion of the light that is generated by the gain region 140 and that passes through the first reflective surface 160 or the second reflective surface 162 may also be returned to the gain region 140 by the DBR 170 and be amplified.

The contact layer 110 is formed on the second cladding layer 108 as shown in FIG. 3. A layer that is in ohmic contact with the second electrode 122 can be used as the contact layer 110. The contact layer 110 is composed of a second conductive semiconductor, for example. A p-type GaAs layer or the like, for example can be used as the contact layer 110.

The contact layer 110 and a portion of the second cladding layer 108 can form columnar semiconductor stacks (hereinafter referred to as "columnar parts") 130. The planar shape of the columnar parts 130 may be the same as that of the gain region 140 in the region in which the second electrode 122 is formed. Specifically, the current path between the electrodes 120, 122 is determined by the planar shape of the columnar parts 130, for example, and as a result, the planar shape of the gain region 140 is determined. Although not shown in the drawings, the columnar parts 130 can also be composed of the contact layer 110, a portion of the second cladding layer 108, a portion of the active layer 106, and a portion of the first cladding layer 104 in the region in which the second electrode 122 is formed, for example.

The insulation part 112 can be provided on the second cladding layer 108 and on the side of the columnar parts 130, as shown in FIGS. 1 and 3. The insulation part 112 can be adjacent to the side surface of the columnar parts 130. The upper surface of the insulation part 112 may be continuous with the upper surface of the contact layer 110, for example. An SiN layer, SiO$_2$ layer, polyimide layer, or other layer, for example, can be used as the insulation part 112. When these materials are used as the insulation part 112, the current between the electrodes 120, 122 avoids the insulation part 112 and can flow through the columnar parts 130 sandwiched by the insulation part 112. The insulation part 112 may be provided at least to the region of the peripheral edges of the columnar parts 130 as viewed two-dimensionally. In the example shown in FIG. 2, the insulation part 112 may be provided in the same region as the second electrode 122, other than in the regions in which the columnar parts 130 are formed.

Although not shown in the drawing, the insulation part 112 may cover the side surface forming the columnar parts 130 other than the surface from the first end 151 to the sixth end surface 156. The insulation part 112 may have a lower refractive index than the active layer 106. In this case, the effective refractive index of the vertical cross-section of the portion in which the insulation part 112 is formed is smaller than the effective refractive index of the portion in which the insulation part 112 is not formed, i.e., the vertical cross-section of the portion in which the columnar parts 130 are formed. Light can thereby be efficiently confined within the gain region 140 in the planar direction. A configuration may also be adopted in which the insulation part 112 is not provided. The insulation part 112 may also be air, for example. In this case, a configuration may be adopted in which the active layer 106 and the first cladding layer 104 are not included in the columnar parts 130. A configuration may also be adopted in which the second electrode 122 described hereinafter is formed so as not to directly contact the active layer 106 and the first cladding layer 104.

The first electrode 120 is formed on the entire lower surface of the substrate 102. The first electrode 120 can be adjacent to a layer (substrate 102 in the example shown in the drawing) that is in ohmic contact with the first electrode 120. The first electrode 120 is electrically connected to the first cladding layer 104 via the substrate 102. The first electrode 120 is one of the electrodes for driving the light emitting device 100. An electrode in which a Cr layer, an AuGe layer, a Ni layer, and an Au layer are layered in sequence from the substrate 102, for example, can be used as the first electrode 120. A configuration may also be adopted in which a second contact layer (not shown) is provided between the first cladding layer 104 and the substrate 102, the second contact layer is exposed by dry etching or the like, and the first electrode 120 is provided on the second contact layer. A single-sided electrode structure can thereby be obtained. This arrangement is particularly effective when the substrate 102 is an insulator.

The second electrode 122 can be formed on the entire surface of the contact layer 110 and insulation part 112, as shown in FIG. 3. When the active layer 106 or both the active layer 106 and first cladding layer 104 are included in the columnar parts 130, and the insulation part 112 is not provided, the second electrode 122 are preferably formed in localized fashion only on the contact layer 110 (columnar parts 130), for example, so that there is no direct electrical connection between the second electrode 122 and the active layer 106 or first cladding layer 104. The second electrode 122 is electrically connected to the second cladding layer 108 via the contact layer 110. The second electrode 122 is the other electrode for driving the light emitting device 100. An electrode in which a Cr layer, an AuZn layer, and an Au layer are layered in sequence from the contact layer 110, for example, can be used as the second electrode 122. The surface of contact between the second electrode 122 and the contact layer 110 has the same planar shape as the gain region 140.

The light emitting device 100 of the present embodiment can be used as the light source of a projector, display, illumination device, measurement device, or the like, for example. The same applies to the embodiments described hereinafter.

The light emitting device 100 has the following characteristics, for example.

In the light emitting device 100, laser oscillation of light generated by the gain region 140 can be suppressed or prevented, as described above. Speckle noise can therefore be reduced. Furthermore, in the light emitting device 100, the light generated by the gain region 140 can be amplified while propagating in the gain region 140, and be emitted to the outside. Consequently, a higher output than that of the conventional LED can be obtained. Through the present embodiment as described above, a novel light emitting device can be provided that has high output and the capability of reducing speckle noise.

In the light emitting device 100, the first emitted light 20 and second emitted light 22 emitted from the first end surface 151 and second end surface 152, respectively, can proceed in the same direction. An optical system of a subsequent stage not shown in the drawing can thereby be reduced in size relative to a case in which two emitted lights proceed in divergent directions, for example.

In the light emitting device 100, a portion of the light generated by the first portion 142 of the gain region 140 is reflected at the first reflective surface 160 and the second reflective surface 162, and can be amplified while propagating in the third portion 146 and second portion 144 as well. The same applies for a portion of the light generated by the second portion 144. Consequently, depending on the light emitting device 100 of the present embodiment, since the distance over which the light intensity is amplified is increased relative to a case in which no reflection occurs at the first reflective surface 160 on the second reflective surface 162, high light output can be obtained.

In the light emitting device 100 of the present embodiment, the DBR 170 composed of a plurality of grooves 172 can be provided to at least one of the side of the first reflective surface 160 and the side of the second reflective surface 162. Consequently, depending on the light emitting device 100, the size of the device can be reduced relative to a case in which a mirror part is provided outside the light emitting device, for example. Furthermore, since the DBR 170 can be manufactured by a planar process, the amount of raw materials used can be reduced while production properties are enhanced relative to a case in which a dielectric mirror is formed after cleaving each chip, for example.

1.2. A method for manufacturing the light emitting device 100 of the first embodiment will next be described with reference to the drawings.

Figure 6:
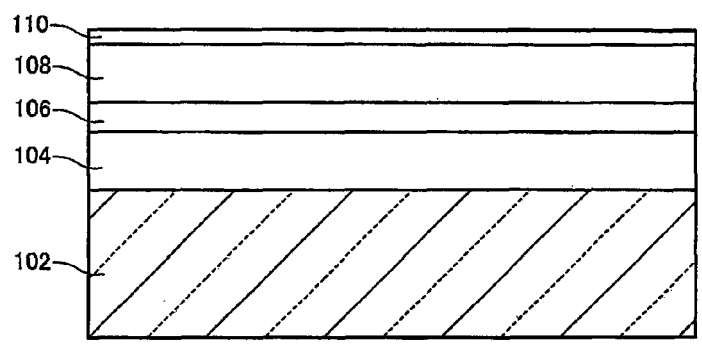
FIG. 6 is a schematic sectional view showing the steps for manufacturing the light emitting device of the first embodiment.
Figure 7:
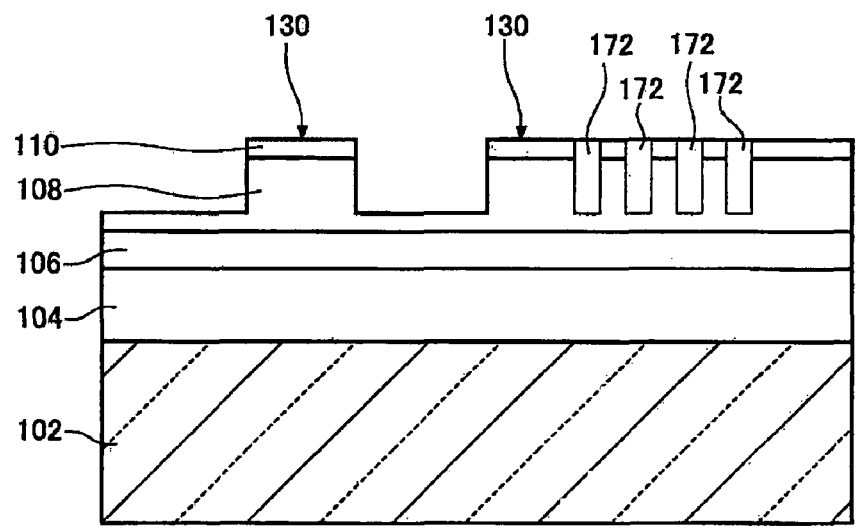
FIG. 7 is a schematic sectional view showing the steps for manufacturing the light emitting device of the first embodiment.
Figure 8:
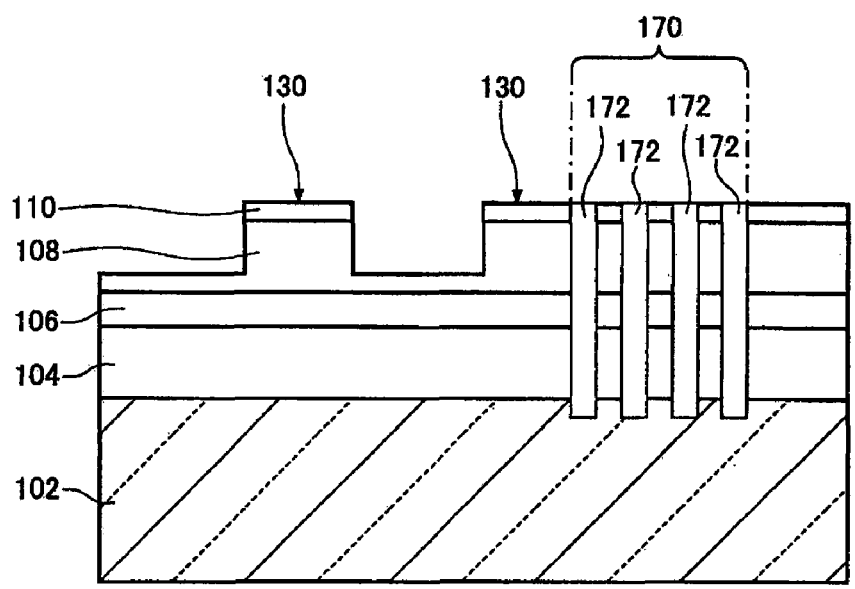
FIG. 8 is a schematic sectional view showing the steps for manufacturing the light emitting device of the first embodiment.

FIGS. 6 through 8 are schematic sectional views showing the steps for manufacturing the light emitting device 100, and correspond to the sectional view shown in FIG. 3.

As shown in FIG. 6, the first cladding layer 104, the active layer 106, the second cladding layer 108, and the contact layer 110 are first formed in sequence on the substrate 102 by epitaxial growth. Examples of epitaxial growth methods that can be used is MOCVD (Metal Organic Chemical Vapor Deposition), MBE (Molecular Beam Epitaxy), and the like.

The contact layer 110 and the second cladding layer 108 are then patterned as shown in FIG. 7. A photolithography technique, etching technique, or other technique, for example, is used for patterning. The columnar parts 130 and grooves 172 having about the same depth as the columnar parts 130 are thereby formed.

The grooves 172 are then etched to a predetermined depth, as shown in FIG. 8. This etching is performed in the same manner as in the step shown in FIG. 7. The grooves 172 constituting the DBR 170 are thereby formed. In the steps described above, the grooves 172 are formed by performing additional etching after being patterned at the same time as the columnar parts 130. However, the grooves 172 may also be formed by a single step of patterning the contact layer 110, second cladding layer 108, active layer 106, first cladding layer 104, and substrate 102 after the columnar parts 130 are formed. Misalignment of the etching due to alignment error of the photomask or other conditions can thereby be prevented relative to a case in which additional etching is performed.

As shown in FIG. 3, the insulation part 112 is then formed so as to cover the side surfaces of the columnar parts 130. Specifically, an insulation layer (not shown) is first formed above the second cladding layer 108 (including on the contact layer 110) by CVD (Chemical Vapor Deposition), coating application, or another method, for example. The upper surface of the contact layer 110 is then exposed by an etching technique or the like, for example. The insulation part 112 can be formed by the process described above. In the present step, the grooves 172 can also be embedded in the insulation layer. A configuration may also be adopted in which the region of the grooves 172 is covered by a resist film (not shown), and the insulation layer is thereby not embedded in the grooves 172.

The second electrode 122 is then formed on the insulation part 112 and contact layer 110 constituting the columnar parts 130, as shown in FIG. 3. The second electrode 122 can be formed in the desired shape by a photolithography technique by covering a predetermined region with a resist film (not shown), and then performing vacuum deposition and lift-off, for example. A region larger than that of the grooves 172 is preferably covered by a resist film or the like, for example, so that the electrode material does not enter the grooves 172 and short-circuit the region in which the DBR 170 is formed.

The first electrode 120 is then formed below the lower surface of the substrate 102. The method for fabricating the first electrode 120 is the same as the method described above for fabricating the second electrode 122, for example. The sequence in which the first electrode 120 and the second electrode 122 are formed is not particularly limited.

The antireflective film 114 is then formed on the entire surface of the first side surface 105, as shown in FIG. 2. The antireflective film 114 is formed by CVD (Chemical Vapor Deposition), sputtering, ion assisted deposition, or another method, for example.

The light emitting device 100 can be manufactured by the process described above.

1.3 A modification of the light emitting device of the present embodiment will next be described. Only those aspects that differ from the example of the light emitting device 100 shown in FIGS. 1 through 3 described above will be described, and no redundant description of the same aspects will be given.

(1) A first modification will first be described.

FIG. 9 is a schematic plan view showing the light emitting device 200 of the present modification. FIG. 10 is a sectional view along line X-X of FIG. 9. The plan view shown in FIG. 9 corresponds to FIG. 2.

In the example of the light emitting device 100, a case was described in which the DBR 170 is provided to the sides of the reflective surfaces 160, 162. In the present modification, however, photonic crystal regions 180 may be provided to the sides of the reflective surfaces 160, 162.

The photonic crystal regions 180 are composed of a plurality of holes 182 arranged periodically in a predetermined lattice arrangement in the in-plane direction of the active layer 106. Specifically, the photonic crystal regions 180 have a two-dimensional photonic crystal structure in which a periodic refractive index distribution is formed in the planar direction. The shape of the holes 182 is columnar, for example. The bottom surface of the holes 182 may be positioned lower than the lower side surface of the active layer 106, for example. The bottom surface of the holes 182 may be higher than the upper surface of the active layer 106 insofar as an adequate number of periods is provided. In the example shown in the drawing, a plurality of holes 182 is arranged at equal intervals in a square lattice pattern. The holes 182 may be arranged in a triangular lattice, a rectangular lattice, a honeycomb lattice, a circular lattice, or other arrangement, for example. The holes 182 have a columnar shape in the example shown. The planar shape of the holes 182 may be circular, elliptical, triangular, square, or another shape. When the design wavelength is 630 nm, the size of the interval d of the holes 182 may be about 231 nm, and the size of the radius r of the openings of the holes 182 may be about 134 nm. An adequate reflection spectrum can be obtained even when the photonic crystal regions 180 is of a size that allows formation by a photolithography technique (including an interference exposure technique, immersion exposure technique, or other technique). The interior of the holes 182 may be hollow or filled with an insulating material. The photonic crystal region may include a region having a periodic photonic crystal structure, or a cylindrical polar coordinate lattice, a quasi-photonic crystal structure having a quasi-period photonic crystal, or other structure, for example. High reflectance can be obtained from the first reflective surface 160 and the second reflective surface 162 by providing the photonic crystal region.

The holes 182 may be formed using a photolithography technique, etching technique, or other technique, for example. The photonic crystal regions 180 composed of the holes 182 can thereby be formed.

Through the present modification, the photonic crystal regions 180 can be provided instead of the DBR 170 on the sides of the reflective surfaces 160, 162. A novel light emitting device can thereby be provided that has high output and the capability of reducing speckle noise, the same as in the first embodiment described above.

(2) A second modification will next be described.

Figure 11:
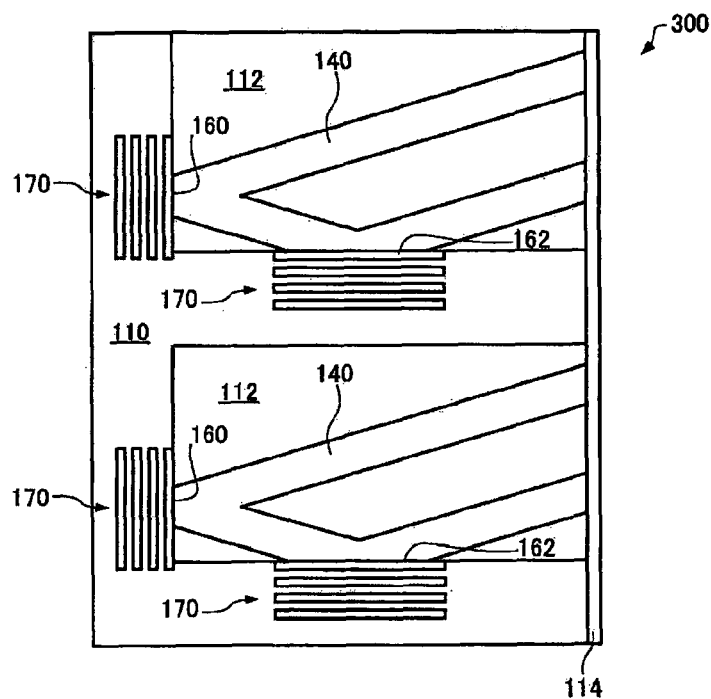
FIG. 11 is a schematic plan view showing a second modification of the light emitting device according to the first embodiment.

FIG. 11 is a schematic plan view showing the light emitting device 300 according to the present modification. The plan view shown in FIG. 11 corresponds to FIG. 2.

In the example of the light emitting device 100, a case was described in which a single gain region 140 is provided. In the present modification, however, a plurality (two in the example shown in FIG. 11) of gain regions 140 may be provided. A DBR 170 may be provided beside each of the reflective surfaces 160, 162 of the gain regions 140. Photonic crystal regions 180 may also be formed instead of the DBR 170. Since the DBR 170 and the photonic crystal regions 180 can be manufactured by a planar process as described above, an array can more easily be formed than in a case in which a dielectric mirror is formed or cleaved for each chip, for example.

Through the present modification, a higher output can be obtained from the light emitting device as a whole in comparison to the light emitting device 100.

(3) A third modification will next be described.

The light emitting device 100 was described as being an InGaAlP-type light emitting device, but any material from which a light emitting gain region can be formed may be used in the present modification. For example, an AlGaN, InGaN, GaAs, InGaAs, GaInNAs, ZnCdSe, or other type of semiconductor material may be used as the semiconductor material. In the present modification, a GaN substrate or the like, for example, may be used as the substrate 102. An organic material or the like, for example, may also be used in the present modification.

The modifications described above are merely examples, and are not limiting. For example, the modifications can also be appropriately combined. These modifications can also be applied as needed to the embodiments described hereinafter.

2. Second Embodiment 2.1 The light emitting device 400 according to a second embodiment will next be described, but the examples described below are not limiting.

Figure 12:
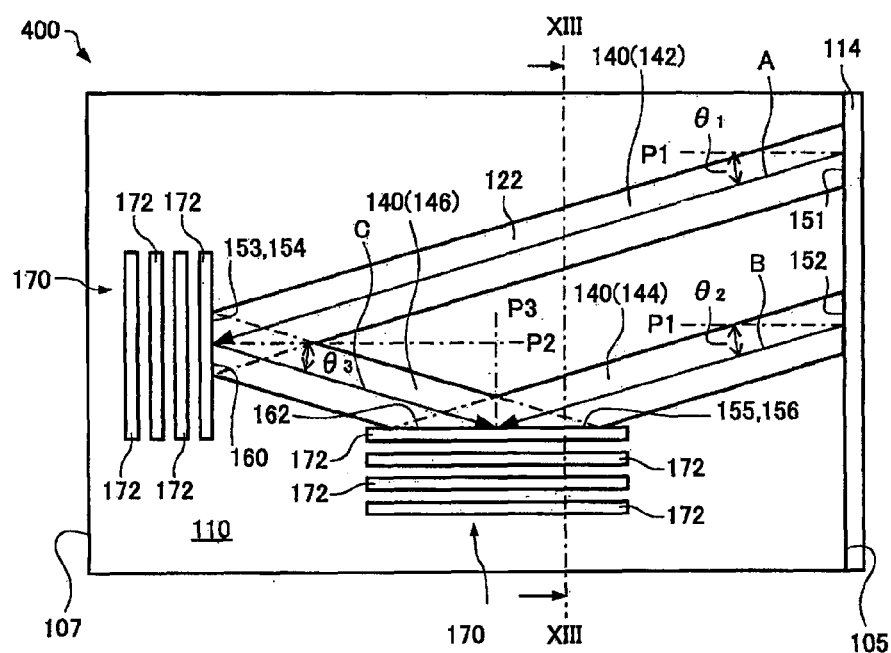
FIG. 12 is a schematic plan view showing the light emitting device according to the second embodiment.

FIG. 12 is a schematic plan view showing the light emitting device 400, and FIG. 13 is a sectional view along line XIII-XIII of FIG. 12. The same reference numerals are used to refer to members of the light emitting device 400 according to the second embodiment that have the same functions as constituent members of the light emitting device 100 of the first embodiment, and no detailed description thereof will be given.

As shown in FIGS. 12 and 13, the light emitting device 400 includes the first cladding layer 104, the active layer 106, and the second cladding layer 108. The light emitting device 400 may also include the substrate 102, contact layer 110, antireflective film 114, first electrode 120, second electrode 122, and DBR 170.

The second cladding layer 108 may be formed on the active layer 106. The contact layer 110 may be formed on the second cladding layer 108. As shown in FIG. 13, the second cladding layer 108 and the contact layer 110 do not form columnar parts 130.

The second electrode 122 is formed on the contact layer 110. The second electrode 122 is electrically connected to the second cladding layer 108 via the contact layer 110. The lower surface of the second electrode 122 has the same planar shape as the gain region 140, as shown in FIG. 12. In the example shown, the current path between the electrodes 120, 122 is determined by the planar shape of the connection region of the second electrode 122 and the contact layer 110, and as a result, the planar shape of the gain region 140 can be determined. In the example shown in the drawing, both the upper and lower surface of the second electrode 122 have the same planar shape as the gain region 140.

Depending on the present embodiment, a novel light emitting device can be provided that has high output and the capability of reducing speckle noise, the same as in the first embodiment described above.

2.2. An example of the method for manufacturing the light emitting device 400 of the second embodiment will next be described with reference to the drawings, but the example described below is not limiting. Only those aspects that differ from the method for manufacturing the light emitting device 100 of the first embodiment described above will be described, and no detailed description of the same aspects will be given.

FIG. 14 is a schematic sectional view showing the steps for manufacturing the light emitting device 400, and corresponds to the sectional view shown in FIG. 13.

The first cladding layer 104, active layer 106, second cladding layer 108, and contact layer 110 are first formed on the substrate 102.

The grooves 172 are then formed. The grooves 172 are formed using a photolithography technique, etching technique, or other technique, for example.

The second electrode 122 is then formed, as shown in FIG. 14. The second electrode 122 can be formed in the desired shape by a photolithography technique by covering a predetermined region with a resist film (not shown), and then performing vacuum deposition and lift-off, for example.

The first electrode 120 and the antireflective film 114 are then formed.

The light emitting device 400 can be manufactured by the process described above.

2.3 A modification of the light emitting device of the present embodiment will next be described. Only those aspects that differ from the example of the light emitting device 400 shown in FIGS. 12 and 13 described above will be described, and no description of the same aspects will be given.

FIG. 15 is a schematic sectional view showing the light emitting device 500 according to the present modification. The sectional view shown in FIG. 15 corresponds to the sectional view shown in FIG. 13.

In the example of the light emitting device 400, a case was described in which the upper surface and the lower surface of the second electrode 122 both have the same planar shape as the gain region 140, as shown in FIGS. 12 and 13. In the present modification, however, the upper surface of the second electrode 122 may have a different planar shape than the gain region 140, as shown in FIG. 15. In the present modification, insulation layers 502 having opening sections are formed on the contact layer 110, and the second electrode 122 may be formed so as to fill the opening sections. The insulation layers 502 are formed on the periphery of the gain region 140, for example, as viewed two-dimensionally. The second electrode 122 is formed in the opening sections and on the insulation layers (502. In the present modification, the lower surface of the second electrode 122 has the same planar shape as the gain region 140, and the upper surface of the second electrode 122 is the entire surface above the insulation layers 502 and these opening sections.

An SiN layer, $SiO_2$ layer, polyimide layer, or other layer may be used as the insulation layers 502. The insulation layers 502 are formed by CVD, coating application, or another method, for example.

Through the present modification, since the volume of the second electrode 122 increases relative to the example of the light emitting device 400, a light emitting device 500 can have excellent heat dissipation properties.

Modifications are not necessarily limited by the examples described above. These modifications or the examples of the light emitting device 100 may also be applied as needed to the embodiments described above.

3. Embodiments of the present invention are described in detail above, but it will be readily apparent to one skilled in the art that numerous modifications of the present invention are possible in a range that does not depart from the new matter and effects of the present invention. All such modifications are accordingly encompassed by the present invention.

What is claimed is:

1. A light emitting device comprising:
    a first cladding layer;
    an active layer formed above the first cladding layer; and
    a second cladding layer formed above the active layer; wherein
    at least a portion of the active layer constitutes a gain region;
    the gain region is continuous from a first end surface provided to a first side surface of the active layer to a second end surface provided to the first side surface;
    the gain region has a first reflective surface and a second reflective surface for reflecting light generated by the gain region, the first reflective surface and second reflective surface extending from the first end surface to the second end surface;
    the gain region comprises:
    a first portion extending from the first end surface to the first reflective surface in a direction tilted with respect to a normal to the first side surface as viewed two-dimensionally;
    a second portion extending from the second end surface to the second reflective surface in a direction tilted with respect to a normal to the first side surface as viewed two-dimensionally; and
    a third portion extending from the first reflective surface to the second reflective surface in a direction tilted with respect to a normal to the first reflective surface as viewed two-dimensionally;
    a distributed Bragg reflector or a photonic crystal region is provided to at least one of a side of the first reflective surface and a side of the second reflective surface;
    at least a portion of the light generated by the gain region that passes through the first reflective surface or the second reflective surface is returned to the gain region by the distributed Bragg reflector or photonic crystal region; and
    the light generated by the gain region is emitted from the first end surface and the second end surface.

2. The light emitting device according to claim 1, wherein
    the first reflective surface of the gain region is parallel to the first side surface of the active layer as viewed two-dimensionally;
    the normal to the first reflective surface and the normal to the second reflective surface are orthogonal; and
    the distributed Bragg reflector or the photonic crystal region is provided to a side of the second reflective surface.

3. The light emitting device according to claim 2, wherein the light generated by the gain region is totally reflected by the second reflective surface.

4. The light emitting device according to claim 1, wherein the direction in which the first portion extends and the direction in which the second portion extends are the same direction.

5. The light emitting device according to claim 1, wherein the distributed Bragg reflector comprises a plurality of grooves arranged at a predetermined interval.

6. The light emitting device according to claim 5, wherein a bottom surface of the grooves is positioned further downward than a lower surface of the active layer.

7. The light emitting device according to claim 1, wherein the photonic crystal region comprises a plurality of holes arranged periodically in a prescribed lattice arrangement in the in-plane direction of the active layer.

8. The light emitting device according to claim 7, wherein the shape of each of the plurality of holes is columnar, and a bottom surface of the holes is positioned further downward than a lower surface of the active layer.

9. The light emitting device according to claim 1, wherein an antireflective film is provided to the first side surface.

10. The light emitting device according to claim 1, wherein a plurality of the gain regions is provided.

11. The light emitting device according to claim 1, comprising:
    a first electrode electrically connected to the first cladding layer; and
    a second electrode electrically connected to the second cladding layer.

* * * * *